United States Patent
Forbes

(10) Patent No.: US 7,859,046 B2
(45) Date of Patent: *Dec. 28, 2010

(54) BALLISTIC DIRECT INJECTION NROM CELL ON STRAINED SILICON STRUCTURES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 618 days.

This patent is subject to a terminal disclaimer.

(21) Appl. No.: 11/894,308

(22) Filed: Aug. 21, 2007

(65) Prior Publication Data
US 2008/0042126 A1 Feb. 21, 2008

Related U.S. Application Data

(62) Division of application No. 10/840,761, filed on May 6, 2004, now Pat. No. 7,274,068.

(51) Int. Cl.
*H01L 29/792* (2006.01)
(52) U.S. Cl. .................... 257/324; 365/185.28
(58) Field of Classification Search ................ 257/324; 365/185.28
See application file for complete search history.

(56) References Cited

U.S. PATENT DOCUMENTS

| | | |
|---|---|---|
| 4,184,207 A | 1/1980 | McElroy |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |
| 5,330,930 A | 7/1994 | Chi |

(Continued)

FOREIGN PATENT DOCUMENTS

EP 84303740.9 1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—Douglas M Menz
(74) *Attorney, Agent, or Firm*—Leffert Jay & Polglaze, P.A.

(57) ABSTRACT

A nitride read only memory cell comprising a silicon-germanium layer with a pair of source/drain regions. A strained silicon layer is formed overlying the silicon-germanium layer such that the pair of source/drain regions is linked by a channel that is generated in the strained silicon layer during operation of the cell. A nitride layer is formed overlying the substrate. The nitride layer has at least one charge storage region. The nitride layer may be a planar layer, a planar split gate nitride layer, or a vertical split nitride layer. A control gate is formed overlying the nitride layer. Ballistic direct injection is used to program the memory cell. A first charge storage region of the nitride layer establishes a virtual source/drain region in the channel. The virtual source/drain region has a lower threshold voltage than the remaining portion of the channel.

19 Claims, 3 Drawing Sheets

U.S. PATENT DOCUMENTS

| | | | |
|---|---|---|---|
| 5,378,647 | A | 1/1995 | Hong |
| 5,379,253 | A | 1/1995 | Bergemont |
| 5,397,725 | A | 3/1995 | Wolstenholme |
| 5,467,305 | A | 11/1995 | Bertin |
| 5,467,308 | A | 11/1995 | Chang et al. |
| 5,576,236 | A | 11/1996 | Chang |
| 5,768,192 | A | 6/1998 | Eitan |
| 5,792,697 | A | 8/1998 | Wen |
| 5,858,841 | A | 1/1999 | Hsu |
| 5,911,106 | A | 6/1999 | Tasaka |
| 5,946,558 | A | 8/1999 | Hsu |
| 5,966,603 | A | 10/1999 | Eitan |
| 5,994,745 | A | 11/1999 | Hong |
| 6,011,725 | A | 1/2000 | Eitan |
| 6,028,342 | A | 2/2000 | Chang |
| 6,030,871 | A | 2/2000 | Eitan |
| 6,044,022 | A | 3/2000 | Nachumovsky |
| 6,081,456 | A | 6/2000 | Dadashev |
| 6,108,240 | A | 8/2000 | Lavi |
| 6,133,102 | A | 10/2000 | Wu |
| 6,134,156 | A | 10/2000 | Eitan |
| 6,147,904 | A | 11/2000 | Liron |
| 6,157,570 | A | 12/2000 | Nachumovsky |
| 6,172,396 | B1 | 1/2001 | Chang |
| 6,174,758 | B1 | 1/2001 | Nachumovsky |
| 6,175,523 | B1 | 1/2001 | Yang |
| 6,181,597 | B1 | 1/2001 | Nachumovsky |
| 6,184,089 | B1 | 2/2001 | Chang |
| 6,201,282 | B1 | 3/2001 | Eitan |
| 6,201,737 | B1 | 3/2001 | Hollmer |
| 6,204,529 | B1 | 3/2001 | Lung |
| 6,207,504 | B1 | 3/2001 | Hsieh |
| 6,208,557 | B1 | 3/2001 | Bergemont |
| 6,215,702 | B1 | 4/2001 | Derhacobian |
| 6,218,695 | B1 | 4/2001 | Nachumovsky |
| 6,222,768 | B1 | 4/2001 | Hollmer |
| 6,240,020 | B1 | 5/2001 | Yang |
| 6,243,300 | B1 | 6/2001 | Sunkavalli |
| 6,251,731 | B1 | 6/2001 | Wu |
| 6,255,166 | B1 | 7/2001 | Ogura |
| 6,256,231 | B1 | 7/2001 | Lavi |
| 6,266,281 | B1 | 7/2001 | Derhacobian |
| 6,269,023 | B1 | 7/2001 | Derhacobian |
| 6,272,043 | B1 | 8/2001 | Hollmer |
| 6,275,414 | B1 | 8/2001 | Randolph |
| 6,282,118 | B1 | 8/2001 | Lung |
| 6,291,854 | B1 | 9/2001 | Peng |
| 6,297,096 | B1 | 10/2001 | Boaz |
| 6,303,436 | B1 | 10/2001 | Sung |
| 6,313,486 | B1 | 11/2001 | Kencke et al. |
| 6,327,174 | B1 | 12/2001 | Jung |
| 6,348,711 | B1 | 2/2002 | Eitan |
| 6,392,930 | B2 | 5/2002 | Jung |
| 6,417,053 | B1 | 7/2002 | Kuo |
| 6,421,275 | B1 | 7/2002 | Chen |
| 6,429,063 | B1 | 8/2002 | Eitan |
| 6,432,778 | B1 | 8/2002 | Lai |
| 6,461,949 | B1 | 10/2002 | Chang |
| 6,468,864 | B1 | 10/2002 | Sung |
| 6,469,342 | B1 | 10/2002 | Kuo |
| 6,477,084 | B1 | 11/2002 | Eitan |
| 6,486,028 | B1 | 11/2002 | Chang |
| 6,487,050 | B1 | 11/2002 | Liu |
| 6,498,377 | B1 | 12/2002 | Lin |
| 6,514,831 | B1 | 2/2003 | Liu |
| 6,531,887 | B2 | 3/2003 | Sun |
| 6,545,309 | B1 | 4/2003 | Kuo |
| 6,552,387 | B1 | 4/2003 | Eitan |
| 6,559,013 | B1 | 5/2003 | Pan |
| 6,576,511 | B2 | 6/2003 | Pan |
| 6,580,135 | B2 | 6/2003 | Chen |
| 6,580,630 | B1 | 6/2003 | Liu |
| 6,602,805 | B2 | 8/2003 | Chang |
| 6,607,957 | B1 | 8/2003 | Fan |
| 6,610,586 | B1 | 8/2003 | Liu |
| 6,613,632 | B2 | 9/2003 | Liu |
| 6,617,204 | B2 | 9/2003 | Sung |
| 7,221,597 | B2 * | 5/2007 | Forbes .................... 365/185.28 |
| 2001/0001075 | A1 | 5/2001 | Ngo |
| 2001/0004332 | A1 | 6/2001 | Eitan |
| 2001/0011755 | A1 | 8/2001 | Tasaka |
| 2002/0142569 | A1 | 10/2002 | Chang |
| 2002/0146885 | A1 | 10/2002 | Chen |
| 2002/0151138 | A1 | 10/2002 | Liu |
| 2002/0177275 | A1 | 11/2002 | Liu |
| 2002/0182829 | A1 | 12/2002 | Chen |
| 2003/0057997 | A1 | 3/2003 | Sun |
| 2003/0067807 | A1 | 4/2003 | Lin |
| 2003/0117861 | A1 | 6/2003 | Maayan |

FOREIGN PATENT DOCUMENTS

| | | |
|---|---|---|
| EP | 90115805.5 | 2/1991 |
| EP | 01113179.4 | 12/2002 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE $41^{st}$ Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "$E^2$PROM Product Issues and Technology Trends," IEEE 1989, pp. 17-19, Copryright 1989 IEEE.

T. Huang, F. Jong, T. Chao, H. Lin, L. Leu, K. Young, C. Lin, K. Chiu, "Improving Radiation Hardness of EEPROM/Flash Cell by $N_2$0 Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide -Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With a $TiSi_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, Date Unknown.

T. Sugizaki, et al. "New 2-bit/Tr MONOS Type Flash Memory using $Al_2O_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit *Micro*Flash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™—a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Date Unknown.

L. Breuil, et al., "A new 2 isolated-bits/cell flash memory device with self aligned split gate structure using ONO stacks for charge storage," IMEC, Date Unknown.

J. Willer, et al., "UMEM: A U-shape Non-Volatile-Memory Cell," Ingentix GmbH &Co. KG., Infineon Technologies and Saifun Semiconductors, Date Unknown.

S. Kang, et al., "A Study of SONOS Nonvolatile Memory Cell Controlled Structurally by Localizing Charge-Trapping Layer," Samsung Electrons Co., Ltd., Date Unknown.

Y. Roizin, et al., "In-Process Charging in *micro*FLASH® Memory Cells," Tower Semiconductor, Ltd., Date Unknown.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Date Unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Date Unknown.

Y. Roizin, et al., "Retention Characteristics of *micro*FLASH® Memory (Activation Energy of Traps in the ONO Stack)," Tower Semiconductor, Ltd., Date Unknown.

Y. Roizin, et al., "Activation Energy of Traps in the ONO Stack of *micro*FLASH® Memory Cells," Tower Semiconductor, Ltd., Date Unknown.

Y. Roizin, et al., "'Dummy' Gox for Optimization of *micro*FLASH® Technology," Tower Semiconductor, Ltd., Date Unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Date Unknown.

J. Bu, et al., "Retension Reliability Enhanced SONOS NVSM with Scaled Programming Voltage," Microelectronics Lab., Date Unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

\* cited by examiner

BALLISTIC DIRECT INJECTION NROM CELL ON STRAINED SILICON STRUCTURES

RELATED APPLICATIONS

This application is a divisional of U.S. patent application Ser. No. 10/840,761, filed May 6, 2004 now U.S. Pat. No. 7,274,068 and titled "BALLISTIC DIRECT INJECTION NROM CELL ON STRAINED SILICON STRUCTURE," which is commonly assigned and incorporated by reference in its entirety herein.

TECHNICAL FIELD OF THE INVENTION

The present invention relates generally to memory devices and in particular the present invention relates to nitride read only memory (NROM) cells.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. One type of flash memory is a nitride read only memory (NROM). NROM has some of the characteristics of flash memory but does not require the special fabrication processes of flash memory. NROM integrated circuits can be implemented using a standard CMOS process.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance of flash memory transistors needs to increase as the performance of computer systems increases. To accomplish a performance increase, the transistors can be reduced in size. This has the effect of increased speed with decreased power requirements.

However, a problem with decreased flash memory size is that flash memory cell technologies have some scaling limitations due to the high voltage requirements for program and erase operations. As MOSFETs are scaled to deep sub-micron dimensions, it becomes more difficult to maintain an acceptable aspect ratio. Not only is the gate oxide thickness scaled to less than 10 nm as the channel length becomes sub-micron but the depletion region width and junction depth must be scaled to smaller dimensions.

For the reasons stated above, and for other reasons stated below which will become apparent to those skilled in the art upon reading and understanding the present specification, there is a need in the art for a higher performance flash memory transistor.

SUMMARY

The above-mentioned problems with performance, scalability, and other problems are addressed by the present invention and will be understood by reading and studying the following specification.

The present invention encompasses a nitride read only memory (NROM) cell comprising a silicon-germanium layer with a pair of doped regions. A strained silicon layer is formed over the silicon-germanium layer such that the pair of doped regions is linked by a channel in the strained silicon layer.

A nitride charge storage layer is formed over the channel. The nitride layer has at least one charge storage region. A first charge storage region of the nitride layer establishes a virtual source/drain region in the channel. The virtual source/drain region has a lower threshold voltage than the remaining portion of the channel. A control gate formed is over the nitride layer.

Further embodiments of the invention include methods and apparatus of varying scope.

DETAILED DESCRIPTION

Figure 1:
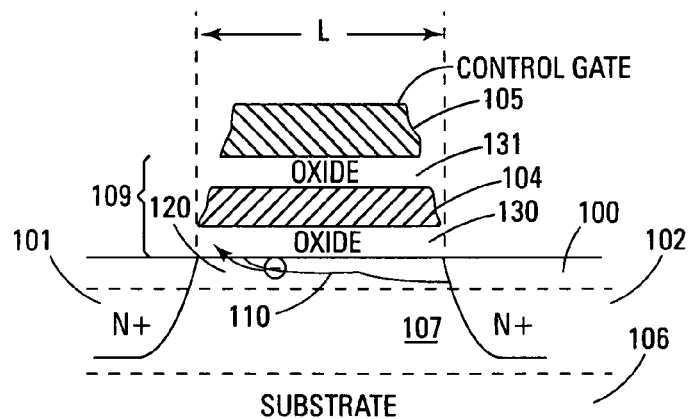
FIG. 1 shows a cross-sectional view of one embodiment of a planar, NROM cell of the present invention, with a strained silicon layer, that is programmable by ballistic direct injection.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 illustrates a cross-sectional view of one embodiment of a planar flash memory cell of the present invention. The cell, in one embodiment, is comprised of a silicon or a silicon-on-insulator (oxide) substrate 106 with a silicon-germanium ($Si_xGe_{1-x}$) layer 107. Two n+ doped regions 101 and 102, acting as source/drain regions, are implanted into the $Si_xGe_{1-x}$ layer 107. The function of the region 101 or 102 is determined by the direction of operation of the memory cell. The doped regions 101 and 102 are separated by a channel region 110 in which a channel forms during operation of the cell.

In the embodiment of FIG. 1, the $Si_xGe_{1-x}$ layer 107 is a p-type material and the source/drain regions 101 and 102 are n-type material. However, alternate embodiments may have an n-type $Si_xGe_{1-x}$ layer with p-type source/drain regions.

A strained silicon layer 100 is formed on the $Si_xGe_{1-x}$ layer 107. Strained silicon takes advantage of the natural tendency of atoms inside compounds to align with one another.

When silicon is deposited on top of a substrate with atoms spaced farther apart, the atoms in the silicon stretch to line up with the atoms beneath, thus "stretching" or "straining" the silicon. In the present embodiment, the strained silicon layer is due to a lattice mismatch between the silicon and the silicon-germanium that has the larger lattice spacing. In the strained silicon, electrons experience less resistance and can flow up to 70 percent faster without having to shrink the size of the transistor.

In one embodiment, the strained silicon layer 100 is formed on the relaxed $Si_xGe_{1-x}$ layer 107 by an ultra-high vacuum chemical vapor deposition (UHVCVD) process. In another embodiment, an ion implantation process on the silicon substrate 106 is employed. The strained silicon layer 100 and $Si_xGe_{1-x}$ layer 107 may also be formed on an insulator to make silicon-on-insulator (SOI) structures. This structure may be formed by UHVCVD, ion implantation, wafer bonding, or other processes.

In additional embodiments, the strained layer 100 can be formed by micromechanical stress on a thin silicon film structure on the silicon substrate 106 or by mechanical stress on a bulk silicon substrate.

A tunnel dielectric 130 is formed over the channel region 110. The tunnel dielectric 130 is generally a silicon oxide, but may be any dielectric material. Some examples include silicon oxides ($SiO/SiO_2$), silicon nitrides ($SiN/Si_2N/Si_3N_4$) and silicon oxynitrides ($SiO_xN_y$).

A nitride floating gate layer 104 is formed over the tunnel dielectric 130. The nitride layer 104 is the charge trapping layer.

Another oxide dielectric layer 131 is formed over the charge trapping nitride layer 104 and may be comprised of a substantially similar material as the tunnel dielectric layer 130. A control gate 105 is formed over the top of the oxide dielectric layer 131 and, in one embodiment, can be made of a doped polysilicon material.

In the embodiment shown in FIG. 1, the tunnel dielectric oxide layer 130, the nitride layer 104, and the gate dielectric layer 131 are considered to be a gate insulator layer 109. This can be referred to as an oxide-nitride-oxide (ONO) layer 109. In one embodiment, the tunnel dielectric layer 130, the nitride layer 104, and the gate dielectric layer 131 are each approximately 5 nm thick. In such an embodiment, the ONO layer 109 would be 15 nm or 150 Å thick. These dimensions are for purposes of illustration only and do not limit the embodiments of the present invention to any particular thickness.

During operation of the memory cell, a channel 110 is formed between the source/drain regions 101 and 102 and in the strained silicon layer 100. In one embodiment, this channel 110 has a length of less than approximately 50 nm. In another embodiment, the channel 110 length is less than approximately 100 nm. Alternate embodiments may use other channel lengths.

During a program operation of the memory cell of FIG. 1, electrons are injected from a pinched off area 120 of the channel region 110 to the charge trapping layer's 104 storage area. The electrons flow in the opposite direction during an erase operation. The memory cell of the present invention employs ballistic injection to perform a programming operation. The ballistic injection provides lower write times and currents. Ballistic injection is possible in this planar single floating gate structure if the gate length is relatively short (i.e., less than approximately 50 nm).

Figure 2:
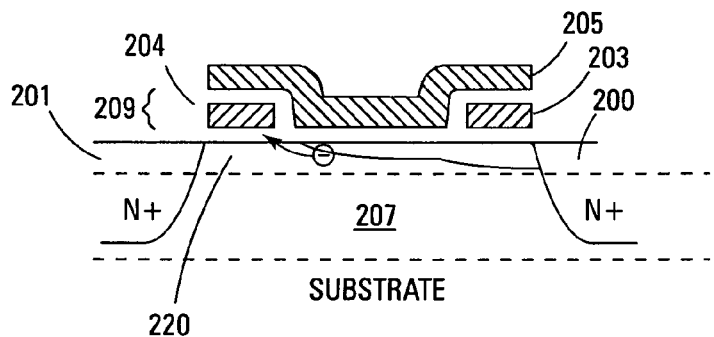
FIG. 2 shows a cross-sectional view of one embodiment of a split nitride layer memory cell of the present invention, with a strained silicon layer, that is programmable by ballistic direct injection.

FIG. 2 illustrates a cross-sectional view of one embodiment of a split nitride layer transistor of the present invention. The composition of this embodiment is substantially similar to the planar embodiment of FIG. 1 including the strained silicon layer 200 over the $Si_xGe_{1-x}$ layer 207. However, the control gate 205 of this embodiment includes a depressed portion that physically separates or "splits" the nitride floating gate layer 203 and 204 such that two charge storage areas 203 and 204 are created. In operation, the memory cell of the present invention can employ ballistic direct injection to perform the programming operation.

The composition of the gate insulator layer 209 is substantially similar to the ONO embodiment of FIG. 1. Alternate embodiments may use other compositions.

FIG. 2 illustrates the pinched off region 220 of the channel and, therefore, the virtual source/drain region, to be under the left charge trapping area 204. However, since this cell is symmetrical, if it is operated in the opposite direction the virtual source/drain region will occur under the right charge trapping area 203.

The ballistic injection in FIG. 2 is accomplished by initially over-erasing the cell. This may be done during a functional test. The over-erase operation leaves the nitride charge trapping areas 203 and 204 with an absence of electrons (i.e., in a positive charge state) and creates "virtual" source/drain regions near the source/drains regions 200 and 201. The virtual source/drain region 220 has a lower threshold voltage than the central part of the channel and is either an ultra thin sheet of electrons or a depleted region with a low energy or potential well for electrons.

When the transistor is turned on with an applied drain voltage, a variation in potential energy is created along the surface of the semiconductor. A potential well or minimum for electrons exists due to the positive charge on the nitride layer storage area 204. When the transistor is turned on, these potential energy minimums for electrons cause a higher density of electrons near the source and the channel pinches off further away from the drain than normal. The length of the pinched-off region 220 is determined by the length of the storage area 204. Hot electrons accelerated in the narrow region 220 near the drain become ballistic and are directly injected onto the nitride layer 204.

In one embodiment, this pinched-off region 220 is in a range of 10-40 nm (100-400 Å). Alternate embodiments have different ranges depending on the storage area length.

The transistor of the present invention is symmetrical and can be operated in either direction to create two possible storage regions when operated in a virtual ground array. Therefore, the above operation description can be applied to the operation of the transistor when the remaining source/drain region is biased such that it operates as a drain region and the virtual source/drain region is on the opposite side of the channel.

Figure 3:
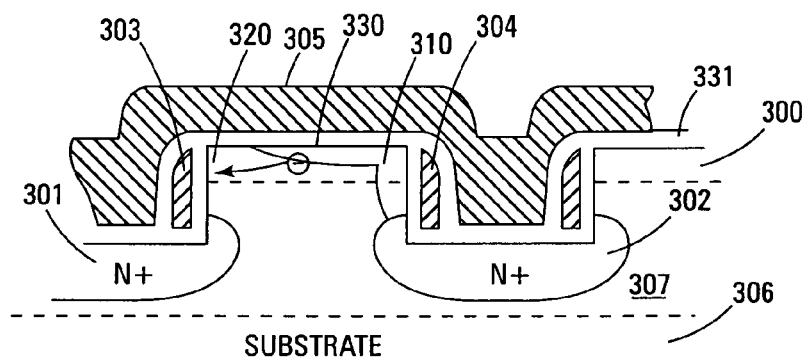
FIG. 3 shows a cross-sectional view of one embodiment of a vertical split nitride layer memory cell, with a strained silicon layer, that is programmable by ballistic direct injection.

FIG. 3 illustrates a cross-sectional view of one embodiment of a vertical split nitride layer flash memory cell of the present invention. The transistor is comprised of a silicon substrate 306 on which a layer of $Si_xGe_{1-x}$ 307 is formed. The layer of $Si_XGe_{1-X}$ 307 includes a plurality of doped regions 301 and 302 that act as source/drain regions. In one embodiment, the substrate is a p-type material and the doped regions are n-type material. Alternate embodiments use an n-type substrate with opposite type doped regions 301 and 302.

The substrate forms a pillar 330 between split floating gate nitride regions 303 and 304 that act as the split charge trapping layer. The pillar provides electrical isolation of the storage regions 303 and 304. A control gate 305 is formed over the storage regions 303 and 304 and substrate pillar 330. An oxide dielectric material 331 provides isolation between the silicon-germanium layer 307, the split nitride layer 303 and 304, and the control gate 305.

The strained silicon layer 300 is formed on the $Si_XGe_{1-X}$ layer 307 on top of each pillar 330. Some of the methods for forming the strained silicon layer 300 have been discussed previously.

A channel region 310 is formed between the storage regions 303 and 304. Additionally, as in the planar embodiment of FIG. 1, a virtual source/drain region 320 is formed by an over-erase operation leaving the nitride storage regions 303 and 304 with an absence of electrons (i.e., in a positive charge state). However, in the vertical split gate embodiment, the virtual source/drain region 320 and channel region 310 are two-dimensional in that they wrap around the corners of the substrate pillar 330.

The operation of the vertical split gate layer transistor embodiment of FIG. 3 is substantially similar to the operations described above for the planar and planar split gate embodiments. A drain bias is applied to one of the source/drain regions 301 or 302 that causes the channel region 310 nearest the drain to pinch off 320 further away from the drain 301 than normal. Hot electrons accelerated in the narrow region 320 near the drain 301 become ballistic and are directly injected onto a storage region 303. The embodiment of FIG. 3 is also symmetrical and can be operated in either direction such that the storage of two bits is possible when operated in a virtual ground array.

Ballistic direct injection is easiest to achieve in a device structure where part of the channel is vertical as illustrated in the embodiment of FIG. 3. Lower write current and times are used since the geometry is conducive to hot electrons being accelerated by the electric fields. Hot electrons coming off of the pinched off end of the channel can be injected onto the floating gate storage regions without undergoing any collisions with the atoms in the lattice. However, ballistic direct injection is not limited to any one cell structure.

In each of the above-described embodiments, the strained silicon layer is formed on the relaxed $Si_XGe_{1-X}$ layer employing UHVCVD, ion implantation, micromechanical strain, or mechanical strain. Alternate embodiments may use other methods. The substrates or bodies below the $Si_XGe_{1-X}$ layer may be a silicon substrate or an insulator in a silicon-on-insulator structure.

In one embodiment, a substrate or well voltage, $V_{sub}$, can be used to assist during a program operation. The substrate bias enables the storage regions to store injected electrons in excess of those that would be stored without the substrate bias. Without the bias, the programming process is self-limiting in that when enough electrons have been collected on a storage region, that region tends to repel any further electrons. The substrate bias results in a significant negative charge to be written to the storage region. The substrate bias is not required for proper operation of the embodiments of the present invention.

In one embodiment, the substrate bias is a negative voltage in a range of −1V to −2V. Alternate embodiments can use other voltages or voltage ranges.

The gate insulators of the above-described embodiments form the barrier for the electron's silicon transistor channel. The gate insulator can be reduced to improve the efficiency of the ballistic injection by using any one of a variety of higher dielectric constant (high-k) gate insulators with an electron affinity higher than that of silicon oxide (i.e., 0.9 eV). Higher dielectric constant insulators can also be used with metal floating gates. This reduces the barrier, Φ, that electrons have to overcome for ballistic injection. A reduced barrier allows programming at even lower voltages with greater efficiency and lower currents.

Figure 4:
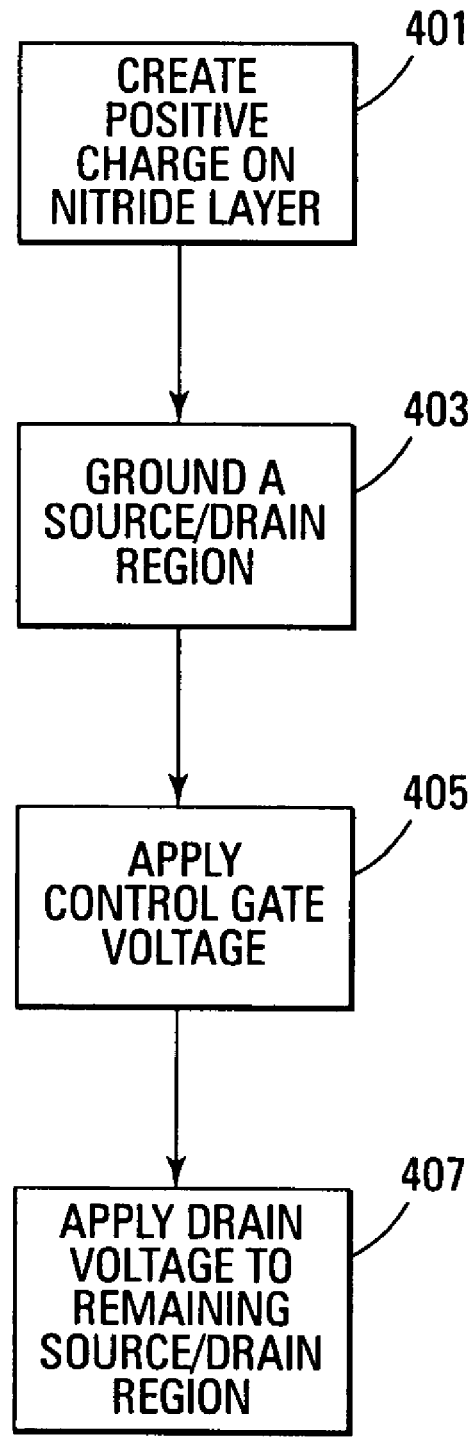
FIG. 4 shows a flowchart of one embodiment of the present invention for programming the NROM cell with ballistic direct injection.

As illustrated in FIG. 4, one embodiment for a method for programming a flash memory cell occurs in flash memory cell comprising a strained silicon layer over a silicon-germanium layer with an ultra-short channel (i.e., <50 nm) in the strained silicon layer. A positive charge is created on the nitride layer 401. This may be accomplished by over-erasing the cell in a split gate structure.

One of the source/drain regions is grounded 403 and a gate voltage is applied to the control gate 405. A voltage is applied to the remaining source/drain region 407 such that ballistic direct injection occurs in a virtual source/drain region of the channel adjacent a section of the floating gate. In one embodiment, a substrate bias can be applied to the substrate to facilitate programming.

Figure 5:
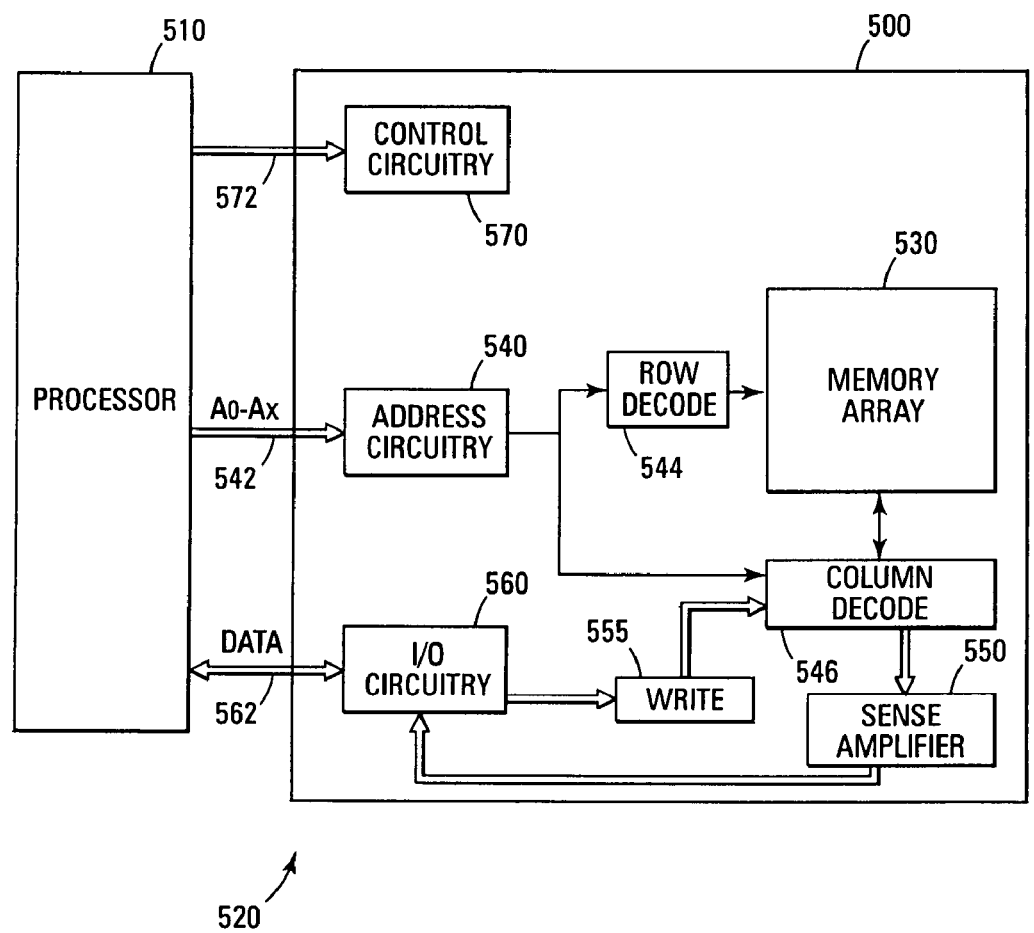
FIG. 5 shows a block diagram of an electronic system of the present invention.

FIG. 5 illustrates a functional block diagram of a memory device 500 that can incorporate the NROM flash memory cells of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of flash memory cells 530 that can be NROM flash memory cells. The memory array 530 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture as well as other architectures.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense amplifier/buffer circuitry 550. The sense amplifier/buffer circuitry, in one embodiment, is coupled to read and latch a row of data from the memory array 530. Data input and output buffer circuitry 560 is included for bidirectional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller.

The NROM device illustrated in FIG. 5 has been simplified to facilitate a basic understanding of the features of the memory and is for purposes of illustration only. A more detailed understanding of internal circuitry and functions of flash memories are known to those skilled in the art. Alternate embodiments may include the NROM cell of the present invention in other types of electronic systems.

CONCLUSION

In summary, an NROM device uses a channel in a strained silicon layer to accelerate electrons near a drain region during a write operation. Using the ballistic direct injection, electrons can be accelerated and easily overcome the silicon-oxide interface potential barrier and be injected onto the nitride charge storage layer. A negative substrate bias may be used to enhance the write operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A nitride read only memory cell comprising:
   a pillar in a silicon-germanium layer, the pillar being defined by a plurality of trenches;
   a pair of source/drain regions, each source/drain region located under a different trench;
   a strained silicon layer formed overlying the silicon-germanium layer at the top of each pillar;
   a pair of vertical nitride charge storage regions that are separated by the pillar; and
   a control gate formed overlying the pair of vertical charge storage regions and the pillar.

2. The cell of claim 1 wherein, during operation of the cell, the pair of source/drain regions are linked by a two-dimensional channel that follows a surface of the pillar.

3. The cell of claim 2 wherein, during operation of the cell, a first nitride charge storage region establishes a virtual source/drain region in the channel adjacent to the first nitride charge storage region, the virtual source/drain region having a lower threshold voltage than a remaining portion of the channel.

4. The cell of claim 1 wherein the pair of vertical nitride charge storage regions form a split nitride layer.

5. The cell of claim 1 wherein a depression of the control gate is formed in the trench to separate a first flash memory cell from a second flash memory cell.

6. The cell of claim 1 and further including an insulator layer under the silicon-germanium layer to form a silicon-on-insulator structure.

7. The cell of claim 1 wherein the source/drain regions link a plurality of flash memory cells in a virtual ground array configuration.

8. The cell of claim 1 wherein the nitride read only memory cell is adapted to be coupled in a NAND flash memory cell array.

9. The cell of claim 1 wherein the nitride read only memory cell is adapted to be coupled in a NOR flash memory cell array.

10. The cell of claim 1 wherein the cell is programmable by ballistic direct injection.

11. The cell of claim 2 wherein the channel is less than 50 nm in length.

12. The cell of claim 2 wherein the channel is less than 100 nm in length.

13. The cell of claim 1 wherein the control gate is separated from the pair of vertical charge storage regions and the pillar by an oxide dielectric material.

14. A nitride read only memory cell array comprising:
    a plurality of non-volatile memory cells coupled together through wordlines and bitlines,
    each cell comprising:
      a pillar in a silicon-germanium layer, the pillar being defined by a pair of trenches;
      a source region located under a first trench of the pair of trenches;
      a drain region located under a second trench of the pair of trenches;
      a strained silicon layer formed overlying the silicon-germanium layer at the top of the pillar;
      a first vertical nitride charge storage region formed in the first trench and adjacent to the pillar
      a second vertical nitride charge storage region formed in the second trench and adjacent to the pillar; and
      a control gate formed overlying the first and second vertical charge storage regions and the pillar.

15. The array of claim 14 wherein, during operation of each cell, the source and drain regions are linked by a channel in the strained silicon layer.

16. The array of claim 15 wherein, during operation of each cell, a first charge storage area establishes a virtual source/drain region in the channel, the virtual source/drain region having a lower threshold voltage than a remaining portion of the channel.

17. The array of claim 14 wherein the plurality of memory cells are configured in a NAND-type architecture.

18. The array of claim 14 wherein the plurality of flash memory cells are configured in a NOR-type architecture.

19. An electronic system comprising:
    a processor that generates memory control signals; and
    an array of non-volatile memory cells coupled to the processor, each cell comprising:
      a pillar in a silicon-germanium layer, the pillar being defined by a first and a second trench;
      a source region located under the first trench;
      a drain region located under the second trench;
      a strained silicon layer formed overlying the silicon-germanium layer at the top of the pillar;
      a first vertical nitride charge storage region formed in the first trench, adjacent and along a first side of the pillar
      a second vertical nitride charge storage region formed in the second trench, adjacent and along a second side of the pillar; and
      a control gate formed overlying the first and second vertical charge storage regions and the pillar.

* * * * *